(12) United States Patent
Gao et al.

(10) Patent No.: US 11,996,261 B2
(45) Date of Patent: May 28, 2024

(54) CARBON NANOTUBE DEVICE

(71) Applicants: Tsinghua University, Beijing (CN); HON HAI PRECISION INDUSTRY CO., LTD., New Taipei (TW)

(72) Inventors: Xin-Yu Gao, Beijing (CN); Guo Chen, Beijing (CN); Ke Zhang, Beijing (CN); Lin Cong, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 102 days.

(21) Appl. No.: 17/679,652

(22) Filed: Feb. 24, 2022

(65) Prior Publication Data
US 2022/0392732 A1 Dec. 8, 2022

(30) Foreign Application Priority Data

Jun. 8, 2021 (CN) .......................... 202110639098.5

(51) Int. Cl.
*H01J 37/09* (2006.01)
*H01J 37/28* (2006.01)

(52) U.S. Cl.
CPC .............. *H01J 37/09* (2013.01); *H01J 37/28* (2013.01)

(58) Field of Classification Search
CPC .. H01J 37/00; H01J 37/02; H01J 37/26; H01J 37/28; H01J 37/09; H01J 37/026; H01J 37/261; H01J 37/06; H01J 37/10; H01J 37/141; H01J 37/12; H01J 37/145; H01J 37/147; H01J 37/1472; H01J 37/1474; H01J 37/153; B82Y 40/00; G01N 23/22; G01N 2223/07
USPC .................. 250/306, 307, 310, 311, 396 R
See application file for complete search history.

(56) References Cited

U.S. PATENT DOCUMENTS

| | | | | |
|---|---|---|---|---|
| 2011/0226960 | A1* | 9/2011 | Zhang | H01J 37/20 250/440.11 |
| 2011/0253907 | A1* | 10/2011 | Qian | H01J 37/20 977/962 |
| 2012/0126115 | A1* | 5/2012 | Heise | G02B 21/34 250/442.11 |
| 2015/0108351 | A1* | 4/2015 | Ogashiwa | H01J 37/263 250/311 |
| 2015/0162164 | A1* | 6/2015 | Damiano, Jr. | H01J 37/20 250/307 |

FOREIGN PATENT DOCUMENTS

| | | |
|---|---|---|
| JP | 2012146417 | 8/2012 |
| JP | 2014-048165 | 3/2014 |

* cited by examiner

*Primary Examiner* — Jason L McCormack
(74) *Attorney, Agent, or Firm* — ScienBiziP, P.C.

(57) ABSTRACT

A method for processing scanning electron microscope specimen is provided. The method comprises: providing a specimen to be observed; providing a carbon nanotube array comprising a plurality of carbon nanotubes; and pulling a carbon nanotube film from the carbon nanotube array, and laying the carbon nanotube film on a surface of the specimen, wherein the carbon nanotube film comprising a plurality of through holes.

13 Claims, 8 Drawing Sheets

CARBON NANOTUBE DEVICE

CROSS-REFERENCE TO RELATED APPLICATIONS

This application claims all benefits accruing under 35 U.S.C. § 119 from China Patent Application No. 202110639098.5, filed on Jun. 8, 2021, in the China Intellectual Property Office, the contents of which are hereby incorporated by reference.

FIELD

The present disclosure relates to a carbon nanotube device.

BACKGROUND

Scanning Electron Microscope (SEM) is an electron optical instrument which mainly uses secondary electron signal imaging to observe a surface morphology of a specimen by the secondary electron emission of the specimen. The secondary electrons can produce an enlarged image of the surface of the specimen. This image is established in time sequence as the specimen is scanned, that is, an enlarged image is obtained using point-by-point imaging. However, for specimens with no or poor conductivity, the electrons generated under high accelerating voltage cannot be directed to the ground, thereby forming a charging effect on the surface of the specimen, which affects the SEM imaging observation. In a conventional solution method, a conductive layer, such as gold, platinum, carbon, etc., is sprayed or evaporated on the surface of the specimen to reduce the charging effect. However, after the conductive layer is formed on the surface of the specimen, it may not be completely removed from the specimen, which may prohibit the specimen to be used again.

BRIEF DESCRIPTION OF THE DRAWINGS

Implementations of the present technology will now be described, by way of example only, with reference to the attached figures, wherein.

DETAILED DESCRIPTION

Figure 1:
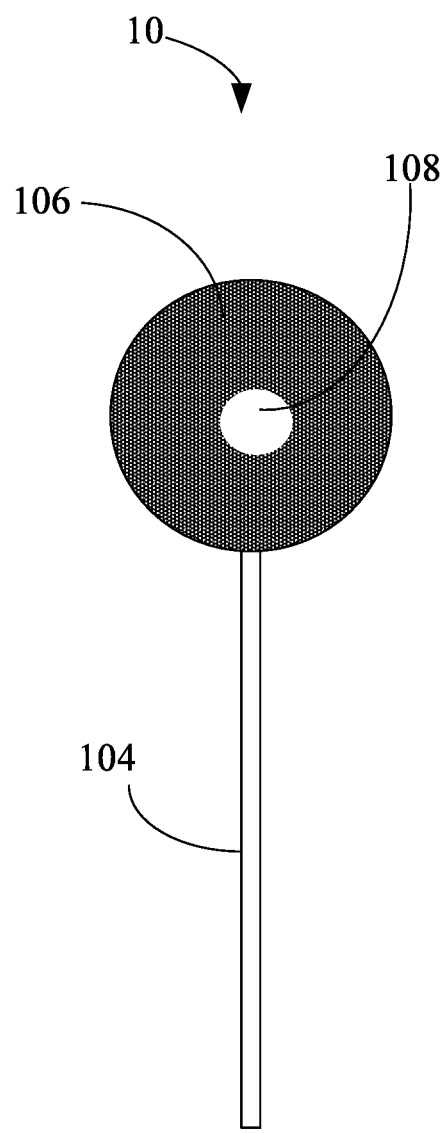
FIG. 1 is a schematic diagram of a carbon nanotube device provided by one embodiment of the present disclosure.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to better illustrate details and features of the present disclosure.

Several definitions that apply throughout this disclosure will now be presented.

The term "substantially" is defined to be essentially conforming to the particular dimension, shape, or other feature which is described, such that the component need not be exactly or strictly conforming to such a feature. The term "comprise," when utilized, means "include, but not necessarily limited to"; it specifically indicates open-ended inclusion or membership in the so-described combination, group, series, and the like.

Figure 2:
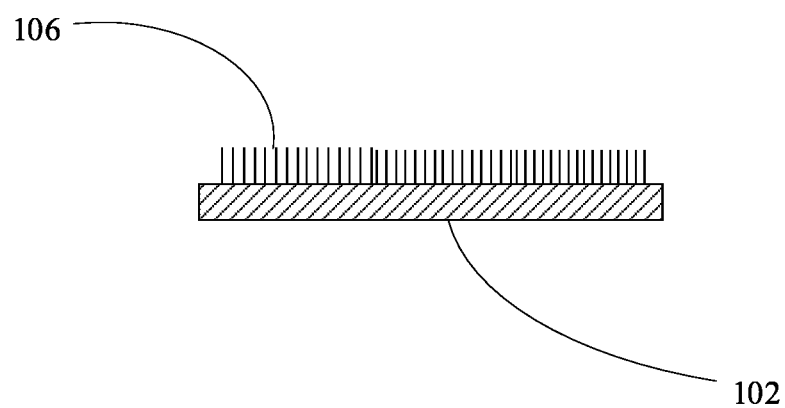
FIG. 2 is a schematic side view of the carbon nanotube device in FIG. 1.

Please refer to FIG. 1 and FIG. 2, one embodiment of the present invention provides a carbon nanotube device 10. The carbon nanotube device 10 comprises a conductive substrate (not labeled) and a carbon nanotube array 106. The conductive substrate comprises a head 102 and a long handle 104. The head 102 defines a through hole 108. The carbon nanotube array 106 is located on the surface of the head 102 and surrounds the through hole 108. The carbon nanotube array 106 comprises a plurality of carbon nanotubes substantially perpendicular to a surface of the head 102.

Figure 3:
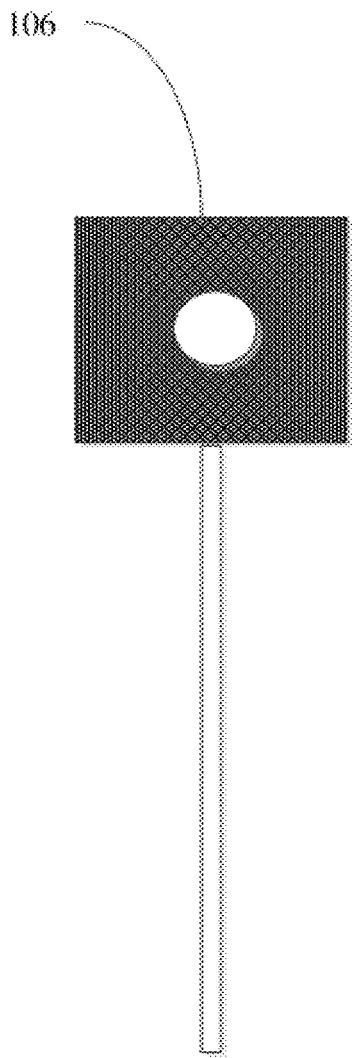
FIG. 3 is a schematic diagram of the carbon nanotube device contacting with a specimen during application provided by one embodiment.

A material of the conductive substrate can be metal, alloy or conductive polymer. In this embodiment, the material of the conductive substrate is copper. The material of the head 102 and the long handle 104 can be the same conductive material or different conductive materials, which can be selected according to actual needs. The head 102 comprises a surface (not shown). The surface can be round, as shown in FIG. 1; it can also be square, as shown in FIG. 3. The surface can be a flat surface or a curved surface, which can be adjusted according to the specimen to be observed.

The carbon nanotube array 106 is fixed to the surface of the head 102 by a conductive glue. The carbon nanotube array 106 is fixed by conductive glue, which can be firmly fixed on the surface of the head 102, and the carbon nanotubes are not easy to fall off. The carbon nanotube array 106 comprises a plurality of carbon nanotubes substantially parallel to each other. The plurality of carbon nanotubes are substantially perpendicular to the surface of the head 102. Regarding "substantially parallel" and "substantially perpendicular", in a macroscopic view, the carbon nanotubes are parallel to each other and perpendicular to the surface of the head 102. However, because carbon nanotubes are microscopic materials, from a microscopic point of view, because the carbon nanotubes themselves are slightly bent or inclined, the carbon nanotubes are not absolutely parallel to each other or are not absolutely perpendicular to the surface of the head 102. The carbon nanotube array 106 can cover an entire surface of the head 102.

The carbon nanotubes in the carbon nanotube array 106 are used to contact the specimen to be observed. During the observation process of the scanning electron microscope, electrons generated on the specimen surface are conducted away by the carbon nanotubes to the conductive substrate, thereby preventing the charging effect on the specimen surface and making the specimen be clearly observed. Each carbon nanotube has a cylinder structure, and defines an longitudinal direction and two opposite ends. One end of the plurality of carbon nanotube is in contact with the specimen, and the other end of the plurality of carbon nanotubes is electrically connected to the conductive head 102. Since the carbon nanotubes have good conductivity in the longitudinal direction, the electrons on the surface of the specimen can be conducted away through the carbon nanotubes.

Figure 4:
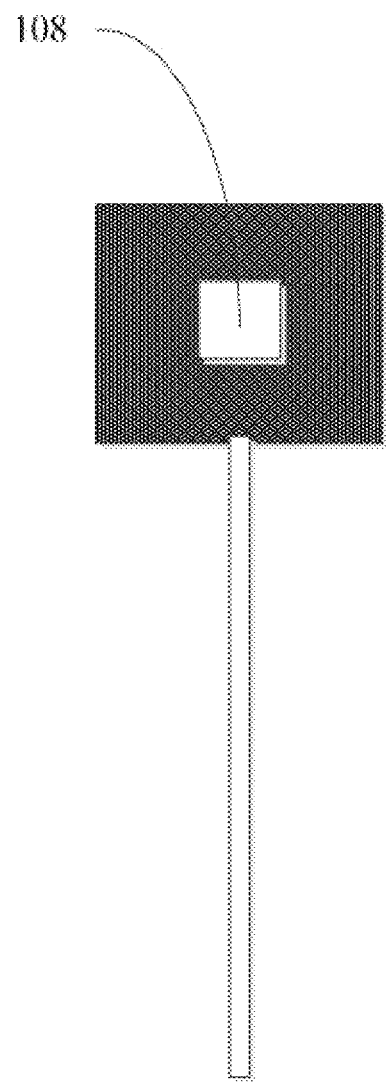
FIG. 4 is a schematic diagram of the carbon nanotube device in an example.

The through hole 108 penetrates the head 102 and the carbon nanotube array 106. A number of through holes 108 is one. The shape of the through hole 108 is not limited, and can be circular, as shown in FIG. 1; or square, as shown in FIG. 4. A shape of the through hole 108 can be selected according to actual needs. The through hole 108 is configured to allow electron beams emitted by the scanning electron microscope to hit the specimen through the through hole 108. A size of the through hole 108 can be selected according to actual needs, and can be less than or equal to 100 microns. In some embodiments—the size of the micropores is in a range from 10 µm to 20 µm.

One end of the long handle 104 is electrically connected to the head 102, and the other end is used for holding, so as to the position of the carbon nanotube device 10 can be precisely controlled. One end of the carbon nanotube array 106 in the carbon nanotube device 10 is exactly contacts the surface of the specimen to be observed. The head 102 of the carbon nanotube device 10 will not press against the surface of the specimen, in case that the carbon nanotube array 106 to deform, or the specimen is damaged. The material of the long handle 104 is a conductive material.

Figure 5:
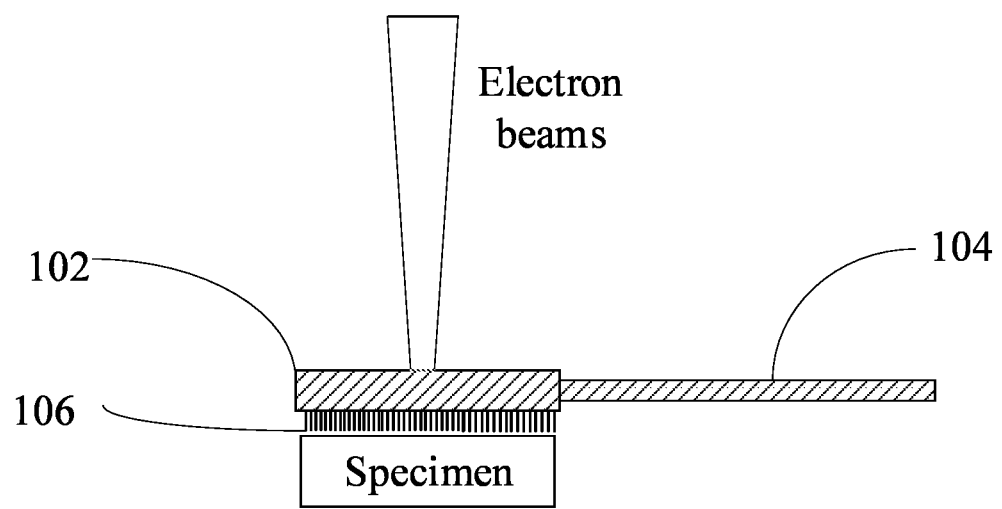
FIG. 5 is a schematic diagram of the carbon nanotube device in another example.

Referring to FIG. 5, when the carbon nanotube device 10 is in use, a manipulator holds the long handle 104 so that one end of the carbon nanotube array 106 in the carbon nanotube device 10 contacts with the surface of the specimen to be observed; electron beams emitted by the scanning electron microscope get through the through hole 108 emit on the specimen, which can take a picture of the specimen surface; because the specimen surface is in contact with and electrically connected to the carbon nanotubes, electrons on the specimen surface are led away by the carbon nanotube device 10, thereby avoiding the charging effect on the surface of the specimen. After the specimen is taken a photo, the carbon nanotube device 10 is removed from the specimen and stored for a next use.

The carbon nanotube device provided by the present invention comprises a vertically arranged carbon nanotube array. One end of the carbon nanotube array is in conductive contact with a conductive substrate, and the other end is in contact with a scanning electron microscope specimen. During the scanning electron microscope observation of the specimen, the electrons generated on the surface of the specimen are led away, thereby preventing the charging effect on the surface of the specimen, so that the morphology of the specimen can be clearly observed. At the same time, after the scanning electron microscopy is completed, the carbon nanotube device and the specimen can be easily separated without causing damage to the specimen and the carbon nanotube device. The carbon nanotube device can be reused.

Figure 6:
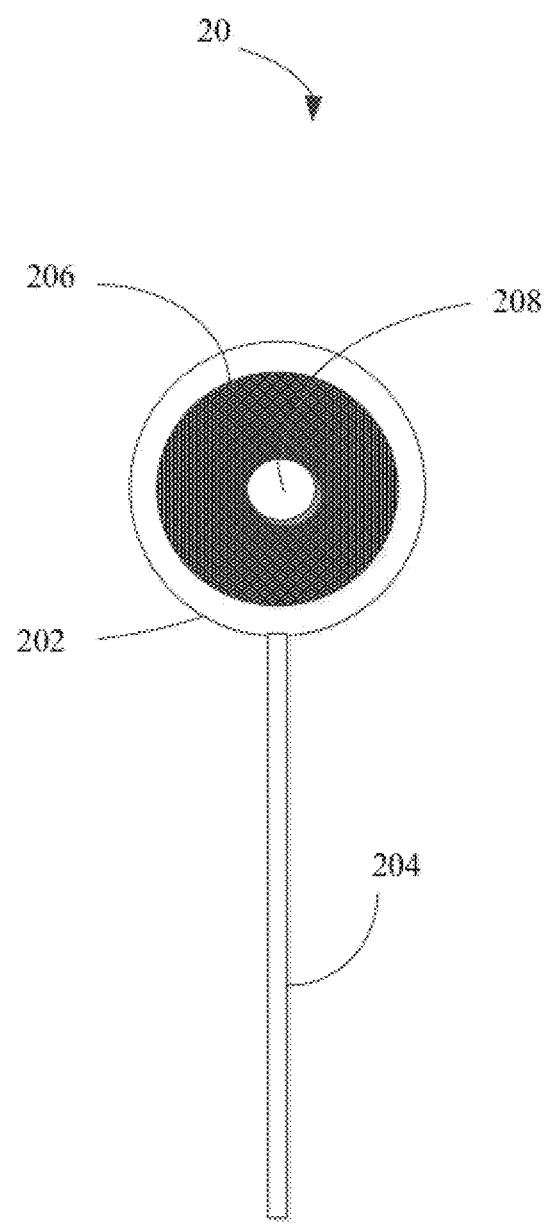
FIG. 6 is a schematic structural diagram of a carbon nanotube device provided by another embodiment of the present disclosure.

Please refer to FIG. 6, another embodiment of the present invention provides a carbon nanotube device 20. The carbon nanotube device 20 comprises a conductive substrate (not shown) and a carbon nanotube array 206. The conductive substrate comprises a head 202 and a long handle 204. The head 202 defines a through hole 208, and a carbon nanotube array 206 is located on the surface of the head 202 and surrounds the through hole 208. The carbon nanotube array 206 does not completely cover the surface of the head 202. A cross-sectional area of the carbon nanotube array 206 can be selected according to actual needs.

Other characteristics of the carbon nanotube device 20 are the same as the carbon nanotube array 10.

Figure 7:
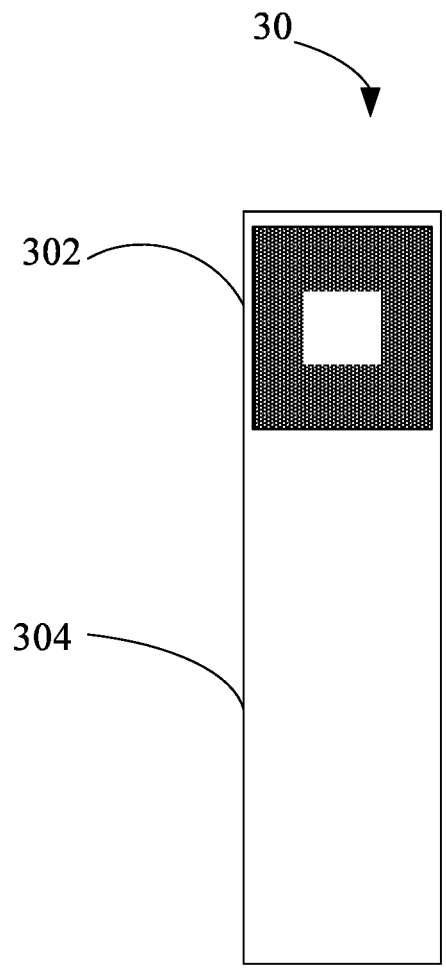
FIG. 7 is a schematic structural diagram of a carbon nanotube device provided by yet another embodiment of the present disclosure.

Please refer to FIG. 7, yet another embodiment of the present invention provides a carbon nanotube device 30. The carbon nanotube device 30 comprises a conductive substrate (not shown) and a carbon nanotube array 306. The conductive substrate comprises a head 302 and a long handle 304. The head 302 defines a through hole 308, and the carbon nanotube array 306 is located on the surface of the head 302 and surrounds the through hole 308. The conductive substrate is a long strip structure as a whole, and one end of the conductive substrate is a head, and the other end is a long handle 304 of the carbon nanotube device 30. The conductive substrate is an integral structure, and one end of the conductive substrate comprises a surface for supporting the carbon nanotube array, and the other end has a certain length that can be held.

Other characteristics of the carbon nanotube device 30 are the same as the carbon nanotube array 10.

Figure 8:
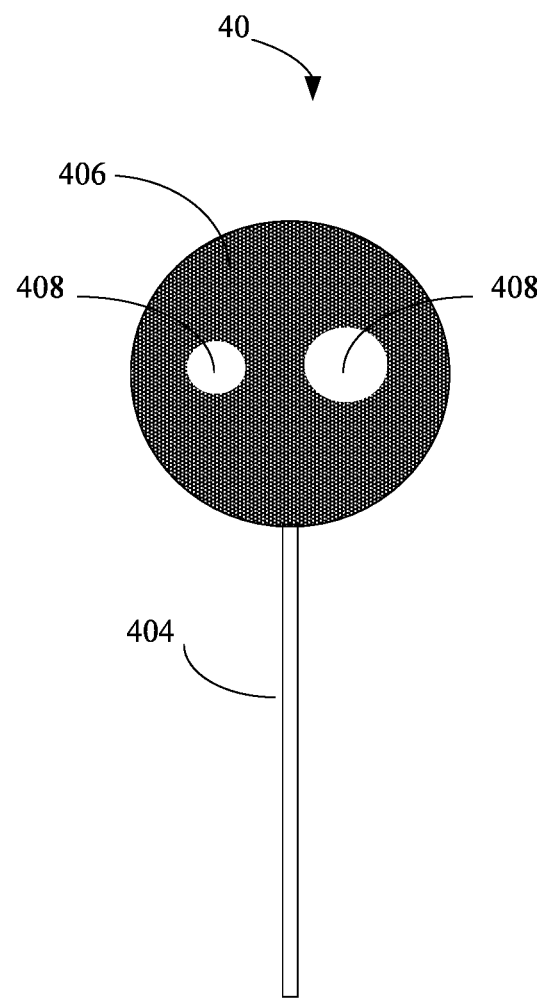
FIG. 8 is a schematic structural diagram of a carbon nanotube device provided by still another embodiment of the present disclosure.

Referring to FIG. 8, yet another embodiment of the present invention provides a carbon nanotube device 40. The carbon nanotube device 40 comprises a conductive substrate (not shown) and a carbon nanotube array 406. The conductive substrate comprises a head (not shown) and a long handle 404. The head defines a plurality of through holes 408, and a carbon nanotube array 406 is provided on the surface of the head and surrounds the plurality of through holes 408. Sizes of the plurality of through holes 408 are different. Shapes of the plurality of through holes 408 can also be different. In this embodiment, a number of the through holes 408 is two, the shape of the plurality of through holes 408 are all circular. When the carbon nanotube device 40 provided in this embodiment is used, which through hole 408 is used to pass the electron beam of the scanning electron microscope is selected according to the size of the specimen to be observed. When the size of the specimen to be observed is small, the through hole 408 with a smaller size is used; when the size of the specimen to be observed is larger, the through hole 408 with a larger size is used.

One embodiment of the present invention further provides a method for using the above-mentioned carbon nanotube device, which comprises the following steps:
 providing a carbon nanotube device comprising a carbon nanotube array and defining a through hole;
 providing a scanning electron microscope specimen, and placing the specimen in an observation area of the scanning electron microscope;
 fixing the carbon nanotube device on a mechanical arm, and moving a position of the mechanical arm so that the carbon nanotube array in the carbon nanotube device is in contact with the specimen; and turning on the scanning electron microscope, electron beams of the scanning electron microscope are emitted on the specimen through the through hole, and the specimen is photographed.

The carbon nanotube device is any one of the carbon nanotube devices 10, 20, or 30 provided in the foregoing embodiments.

A material of the scanning electron microscope specimen can be an insulating material.

The position of the mechanical arm can be precisely controlled by a computer. One end of each carbon nanotube of the carbon nanotube array in the carbon nanotube device is in contact with the surface of the specimen to be observed. The head of the carbon nanotube device does not press the surface of the specimen, in case that the carbon nanotube array is deformed or the specimen is destroyed.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A carbon nanotube device comprising:
   a conductive substrate comprising a head and a handle, the head defining a through hole and comprising a surface surrounding the through hole; and
   a carbon nanotube array only on the surface of the head, and not covering the through hole, wherein the carbon nanotube array comprises a plurality of carbon nanotubes substantially perpendicular to the surface of the head.

2. The device of claim 1, wherein the head and the handle are made of a same conductive material.

3. The device of claim 1, wherein a material of the conductive substrate is metal, alloy or conductive polymer.

4. The device of claim 1, wherein the surface is a flat surface or a curved surface.

5. The device of claim 1, wherein the carbon nanotube array is fixed to the surface of the head by a conductive glue.

6. The device of claim 1, wherein the carbon nanotube array covers an entire surface of the head.

7. The device of claim 1, wherein the plurality of carbon nanotubes in the carbon nanotube array are configured to contact a specimen to be observed.

8. The device of claim 7, wherein one end of the plurality of carbon nanotube is in contact with the specimen, and the other end of the plurality of carbon nanotubes is electrically connected to the conductive head.

9. The device of claim 7, wherein the through hole is configured to direct electron beams emitted by a scanning electron microscope through the through hole to the specimen.

10. The device of claim 1, wherein the through hole penetrates the head and the carbon nanotube array.

11. A carbon nanotube device used in scanning electron microscope, comprising:
    a conductive substrate comprising a head and a handle, the head defining a through hole and comprising a surface surrounding the through hole, wherein the through hole is configured to direct electron beams emitted by the scanning electron microscope through the through hole to a specimen; and
    a carbon nanotube array located only on the surface of the head, not covering the through hole, wherein the carbon nanotube array comprises a plurality of carbon nanotubes substantially perpendicular to the surface of the head, a surface of the carbon nanotube array is configured to contact with the specimen.

12. The device of claim 11, wherein one end of the plurality of carbon nanotube is in contact with the specimen, and the other end of the plurality of carbon nanotubes is electrically connected to the conductive head.

13. The device of claim 11, wherein the through hole penetrates the head and the carbon nanotube array.

* * * * *